United States Patent [19]
Okudaira et al.

[11] Patent Number: 5,127,987
[45] Date of Patent: Jul. 7, 1992

[54] CONTINUOUS ETCHING PROCESS AND APPARATUS THEREFOR

[75] Inventors: Sadayuki Okudaira, Ome; Hideo Komatsu, Tokyo; Osamu Matsumoto, Akishima; Motoichi Kanazawa, Tokyo; Kazuo Sasada, Akishima; Tsuyoshi Naito, Akigawa, all of Japan

[73] Assignee: Kokusai Electric Co., Ltd., Tokyo, Japan

[21] Appl. No.: 607,314

[22] Filed: Oct. 31, 1990

[30] Foreign Application Priority Data
Nov. 20, 1989 [JP] Japan .................. 1-301618

[51] Int. Cl.$^5$ .................. H01L 21/306; B44C 1/22
[52] U.S. Cl. .................. 156/643; 156/646; 156/657; 156/659.1; 156/345
[58] Field of Search ............. 156/643, 646, 650-653, 156/656, 657, 659.1, 662, 345, 668; 204/192.32, 192.35, 192.37, 298.31, 298.35

[56] References Cited
U.S. PATENT DOCUMENTS

| | | | |
|---|---|---|---|
| 4,482,419 | 11/1984 | Tsukada et al. | 156/345 |
| 4,487,678 | 12/1984 | Noguchi et al. | 204/298 |
| 4,825,808 | 5/1989 | Takahashi et al. | 118/719 |
| 4,927,484 | 5/1990 | Mitomi | 156/345 |
| 5,013,385 | 5/1991 | Maher et al. | 156/345 |

*Primary Examiner*—William A. Powell
*Attorney, Agent, or Firm*—Graham & James

[57] ABSTRACT

A plurality of resist membranes are formed on a membrane of goods to be etched. The top resist is patterned by light beam, laser beam, X-rays, or electron beams. The wafer is transferred to a first unit into which discharging gas is introduced and plasma is generated in order to dry-etch the multilayer resists. The multilayer is transferred to a second unit in vacuum environment. In the second unit, the membrane of the wafer is dry-etched in a predetermined depth. The wafer then is transferred to a third unit in vacuum atmosphere so as to remove part of the resist depending a mask pattern and treat the resist by plasma.

10 Claims, 2 Drawing Sheets

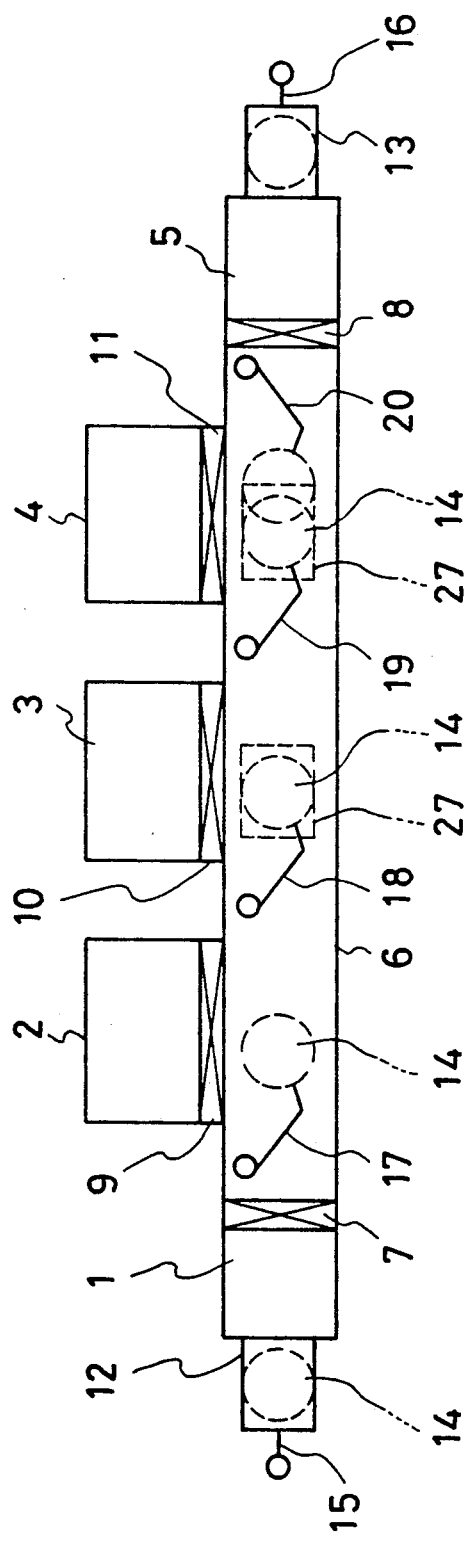
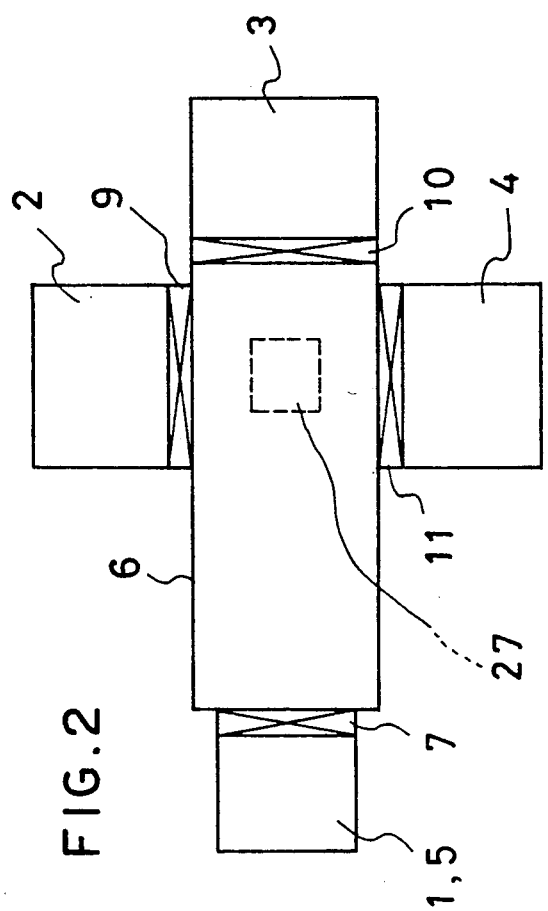

CONTINUOUS ETCHING PROCESS AND APPARATUS THEREFOR

TECHNICAL FIELD

The present invention relates to a continuous etching process and apparatus therefor, in particular, to wafer dry etching steps of a semiconductor manufacturing method, such as a dry etching step for etching masks, a dry etching step for membranes, and then an after-treatment of these steps.

According to the conventional dry etching process, a resist pattern or a mask used in the process has been manufactured by an extra or different technique and appliance other than a dry etching apparatus. Ordinarily, a resist material is exposed to light and then a solution is used to carry out a development treatment. Nowadays, the measurement of the resist pattern to be treated or generated is 0.5 $\mu$m, so that it becomes difficult to make a pattern of photo-resist by the conventional development methods using a unilayer resist. Recently, in order to solve the difficulty of the conventional development method, the resist is made by a multilayer membrane and the top layer membrane is made flat, and the bottom layer of the resist must be vertically treated by oxygen plasma.

Concerning the oxygen plasma method, it is desired to treat or machine the resists by using low gas pressure with good vertical direction and without any shift in size. However, practically it is very difficult to diminish or remove some shift of about 0.7 $\mu$m. Consequently, it is not practical to depend only on oxygen plasma method and it is necessary to employ side wall protective membrane forming process, which has been used in a dry etching, in a resist treatment. Such resist treatment necessitates to use a gas including chlorine.

According to the prior art, various dry etchings mentioned above have been carried out individually using separate treatment applicances or separate treatment unit, wafers after their treatments have been transferred in the atmosphere.

However, when the wafer is exposed to the atmosphere after some treatment, in particular resist treatment with gas containing chlorine, a base material to be etched is disadvantageously apt to corrode and as a result size precision after treatment decreases or desired precision isn't attained.

The reason or mechanism of corrosion seems that halogen element, such as chlorine remained on the top surfaces of wafers, reacts with water in the atmosphere generating acid and the acid reacts with the material etched. The reactions are local cell effects, so that the material is considered to corrode in a very short time.

The purpose of the present invention, under the circumstances above, is to provide an etching process and an apparatus preventing wafer from corroding and manufacturing wafers with a high yield, in the technical field of treating wafers of multi-resist and dry-etching.

BRIEF DESCRIPTION OF THE DRAWINGS

FIG. 1 is a construction view of an embodiment of the continuous etching apparatus executing, FIG. 2 is a construction view of another embodiment.

DETAILED EXPLANATION OF THE PREFERRED EMBODIMENTS

Figure 3:
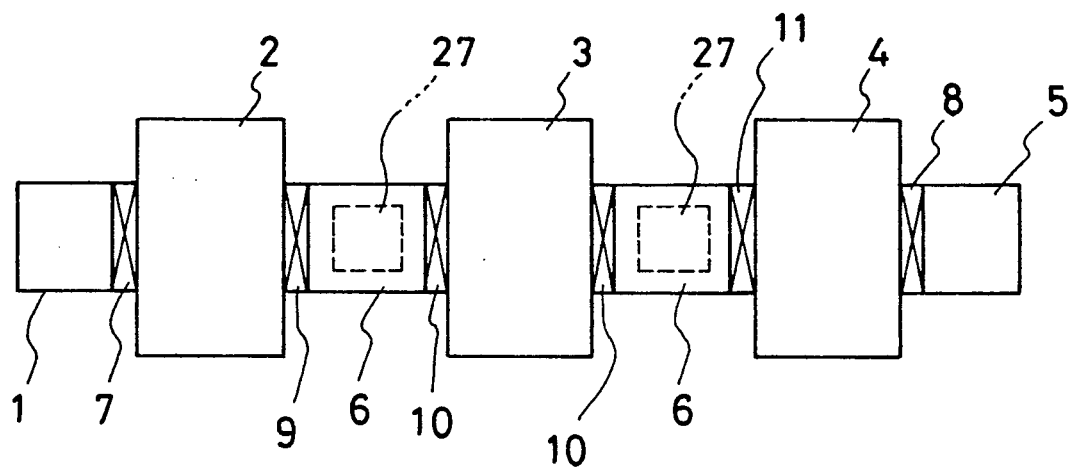
FIG. 3 is a similar view of still another embodiment.

The continuous etching process and the etching apparatus according to the present invention will be explained with reference to the drawings.

The apparatus shown in FIG. 1 consists of six units mentioned below, respectively contained mainly in a pressure-reduced vessel.

The apparatus has a load unit 1, a resist etching unit 2, a plasma etching unit 3, an after-treatment unit 4, and an unload unit 5. The load unit 1 receives goods-to-treated (wafers) in the atmosphere, the resist etching unit 2 for etching resists of the wafer has a wafer temperature control means and an ion energy controller enabling to generate plasma of a gas pressure of 1 m Torr and so on, the plasma etching unit 3 for treating the material to be etched by a plasma etching process has a wafer temperature control means (cooling means or heating means), and the after-treatment unit 4 has a heating means so as to carry out a corrosion prevention treatment onto the wafer by plasma or by heater established in the table. The unload unit 5 unloads treated wafers.

It is noted that the load unit 1 and the unload unit 5 are air-tightly connected and placed at an upstream end and a downstream end of an elongated vacuum conveying chamber 6 through gate valves 7 and 8. The resist etching unit 2, the plasma etching 3 and the after-treatment unit 4 are air-tightly connected to the side face of the elongated vacuum conveying chamber 6 through gate valves 9, 10, and 11.

The load unit 1 has a first cassette receiving stand 12 connected thereto and, the unload unit 5 has a second cassette receiving stand 13 connected thereto. Further, the first cassette receiving stand 12 has a transfer device 15 for transferring wafers 14 to the load unit 1, and the second stand 13 has another transfer device 16 for taking out the wafers of the unload unit 5 and transferring them to a cassette (not shown) setting on the second stand 13.

In the vacuum chamber 6, there are a first conveying unit 17 for conveying wafers 14 from the load unit 1 to the resist etching unit 2, a second conveying unit 18 for conveying the wafers 14 between the resist etching unit 2 and the plasma etching unit 3, a third conveying unit 19 for conveying the wafers 14 between the plasma etching unit 3 and the after-treatment unit 4, and a fourth conveying unit 20 for conveying the wafers 14 between the unload unit 5 and the plasma etching unit 3.

Next, the etching treatment will be explained in detail.

Figure 4:
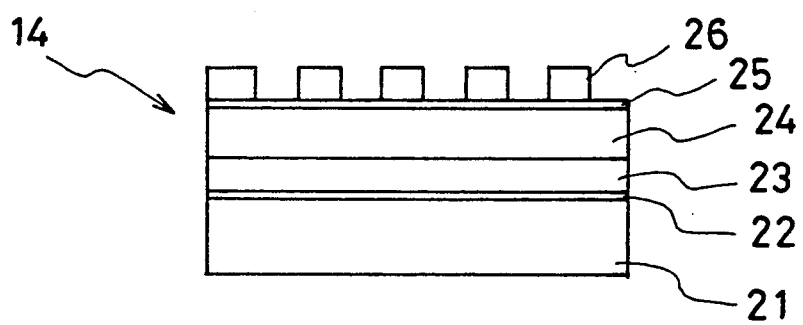
FIG. 4 is an explanation view showing a section of a wafer.

First, the wafers 14 to be treated in the continuous etching apparatus consists as shown in FIG. 4 of a silicon substrate 21, an oxided membrane 22 on the substrate, an Al-0.5% Cu-Si membrane 23 thereon of a thickness of about 1 $\mu$m, a photoresist 24 of a thickness of about 1.5 $\mu$m placed thereon, a glass membrane 25 of about 0.1 $\mu$m on which SOG glass liquid is placed, and the top layer of a photoresist mask 26 ahving a pattern formed by light, laser, X-rays or electron beam. The photoresist 24 is heat-treated at a temperature of 200° C.

The cassette storing the wafer 14 is as shown placed on the first cassette receiving stand 12, and then the wafer is transferred from the cassette to the load unit 1 by means of the transfer device 15. According to the embodiment of the present invention, a surface material of the wafer 14 is Al-Cu-Si.

During these gate valves 9, 10 and 11, respectively being kept at their closed condition, the gate valve 7 is made open and the first conveying unit 17 takes the wafer 14 into the vacuum conveying chamber 6.

Closing the gate valve 7, air in the vacuum conveying chamber 6 is evacuated, making an interior of the chamber vacuum and then the wafer 14 is conveyed to into the resist etching unit 2. Closing the gate valve 9, mixture gas of oxygen and chlorine is supplied to the resist etching unit 2, plasma is generated therein, and the resist is etched with cooling the wafer 14. A complete time of etching treatment is known or judged by a light or luminous monitor and the like detecting condition of plasma.

After completion of etching, the interior of the resist etching unit 2 is evacuated, the gate valve 9 opens, the first conveying unit 17 takes the wafer 14 out of the unit 2, and finally the gate valve 9 shuts. Next, the gate valve 10 of the plasma etching unit 3 opens and the wafer etched 14 is conveyed to the etching unit 3 by means of the second conveying unit 18. The gate valve 10 shuts, a plurality of chlorinous gases are supplied into the plasma etching unit 3 and plasma etching is carried out onto the wafer 14 which is cooling during plasma etching. Again the time of completion of plasma etching is judged by the luminous monitor and the like. After completion of the etching treatment, the plasma etching unit 3 is evacuated, the gate valve 10 opens, the second conveying unit 18 takes the wafer etched 14 out of the unit 3, and finally the gate valve 10 shuts. Next, the gate valve 11 of the after-treatment unit 4 opens and the third conveying unit 19 conveys the wafer etched 14 to the after-treatment unit 4.

In the after-treatment unit 4, a treatment mainly of $O_2$ plasma and a heating treatment of about 200° C. remove the resist from the wafer. The after-treatment generates a protective membrane. This protective membrane is preferably of a kind of easy-removed from the inner wall of the after-treatment unit 4 during etching or removing a next resist, because the protective membrane also generates that inner wall. It is also preferable to use hydrocarbonaceous gas including little hydrogen atoms as a reaction gas used in the after-treatment.

After completion of the after-treatment, the interior of the after-treatment unit 4 is evacuated, the gate valve 11 opens, the third conveying unit 19 takes the wafer 14 out of the unit 19, and the gate valve 11 shuts. After closing of the gate valves 9, 10, and 11, the gate valve 8 opens to convey the wafer treasted 14 to the unload unit 5 by the fourth conveying unit 20. The wafer 14 in the unload unit 5 is transferred to the cassette on the second cassette receiving stand 13 by the second transfer device 16.

When the treatment times of the resist etching, the plasma etching, and the after-treatment, the wafer proceeding through such steps sequentially, are differed from each other, wafer waiting units 27 are used and the wafer 14 is placed thereon in order to diminish the time lag in the respective treatments.

Opening of the gate valves 7 and 8 placed at the upstream end and downstream end of the vacuum conveying chamber 6 is done when the wafers 14 are charged to respective units 2, 3, and 4. When the wafer 14 waits on the wafer waiting unit 27, no operation of opening and closing gate valves 7 and 8 is done in order to prevent the wafer 14 from exposing to the atmosphere until a completion of a series of the treatments.

It is of course possible to keep the gate valves 7 and 8 open, if the cassette receiving stand is in construction able to place in the pressure-reduced vessel containing the load unit 1, the resist etching unit 2, the plasma etching unit 3, the after-treatment unit 4, the unload unit 5, and the vacuum conveying chamber 6 and the treatments are carried out every cassette, in order to improve a throughput of the continuous etching apparatus according to the present invention.

According to the present invention, no corrosion is observed on the wafers if they are exposed to the atmosphere for 24 (twenty four) hours after continuously treated by the etching method of the present invention and taken out of the unload unit 5.

Although Al-Cu-Si of the material to be etched is used in the embodiment above, it is possible to enjoy corresponding effect when Si, Poly Si, $WSi_2$ are used.

Also, the material to be etched in the embodiment above is a unilayer of Al-Cu-Si, but when the unilayer has the second layer membrane of TiW or W, an etching effect is apt to be sufficient or nothing with using only chlorineous mixture gas, because etching speed of the material if TiW, W is very slow in chlorineous gas. Consequently, it had better to etch such material in fluorine. On the contrary, Al-Cu-Si is not etched in fluorineous gas. It has been found that, after Al-Cu-Si is etched in mixture gas of chlorine of a treatment chamber, when the gas is replaced by fluorineous gas and TiW or W is etched under the atmosphere of fluorineous gas, dust is increased. Under the circumstance, when any combination of individual materials of a wafer respectively necessitate chlorineous gas and fluorineous gas of the atmosphere, two treatment chambers are prepared and each material is treated in the particular chamber, decreasing dust. When Al-Cu-Si is etched in an individual chamber, the material is preferably heated to about 80° C. before etching. W is preferably etched in the atmosphere of −50° C. In both cases above, some etching features of etched and finished shapes, etching speeds, and selection ratios are excellent. When the material to be etched is Si, Poly Si, it is preferable to cool it at about −130° C.

The wafers 14 are cooled in the resist etching step and the plasma etching step by various systems of liquified nitrogen and a controllable heater or by various systems of a refrigerator and a controllable heater. The former system is suitable to a heating range from −150° C. to −80° C. and latter system is preferable to a temperature from −80° to 0° C. In the after-treatment step of the etching, a heating means, rather than a cooling means, is necessary and it is preferable to control in the range from the room temperature to 250° C. According to the embodiment of the present invention, in which the etching is carried out after the material is cooled, an absorption efficiency of the gases will become hihg, so that it is permitted to lower a flow rate and partial pressure of, in particular, a deposition gas. In practice, it is possible to carry out a precise etching without size shiftings with only oxygen plasma when no chlorineous gas is blended to the oxygen and the temperature of the material or wafers is −100° C.

Because the treatment effect of etching in the present invention doesn't decrease even the flow rate or pressure of a deposition gas decreases, dirts to be sticked on walls of the vacuum or presure-reduced vessel are considerably reduced and a clean system of semiconductor manufacturing apapratus can be attained. It is of course that effective temperature of the wafer depends on the kind of deposition gas.

FIG. 2 shows another arrangement of various units of the continuous etching apparatus according to the present invention. As shown, the resist etching unit 2, the plasma etching unit 3, and the after-treatment unit 4 are placed radiately around the vacuum conveying chamber 6. FIG. 3 shows still another arrangement, in which various treatment units 2, 3, and 4 are connected through two vacuum chambers 6 and 6'.

It is apparent that the same parts or member of the apparatus, respectively shown in FIGS. 2 and 3 have the same reference numerals.

According to the present invention, a series of etching treatments to be carried on to the material to be etched are done in vacuum without exposing to the atmosphere, so that no corrosion is happened in the wafer, resulting in improved etching or machining precision and improved yields of the product. Comparing to the conventional after-treatment for preventing the wafer from corroding in the atmosphere, the unique corrosion prevention method of the present invention, which employing a protective membrane finally applied on the top of the wafer, necessitates the least number of deposition membrane which is easily removed just before the following step of its application. Owing to an effect of the continuous vacuum treatment of the present invention, it is possible to exceedingly decrease dirts on the wafer and dust generation in the environment, obtaining good trust in functions of the wafer.

What is claimed is:

1. A continuous etching method for semiconductor wafers comprising the steps of:
    forming a multilayer resist on a membrane to be etched;
    patterning the top resist by any of light, laser, X-ray, and electron beam;
    introducing gas to a first treatment unit so as to discharge plasma;
    dry-etching the multilayer resist of the wafer to be treated;
    conveying said wafer in a vacuum environment to a wafer waiting unit at which the wafer is held for subsequent treatment;
    conveying said wafer in a vacuum environment to a second tratement unit;
    dry-etching the membrane to be etched in a predetermined depth in said second treatment;
    conveying said wafer in a vacuum environment to another wafer waiting unit;
    conveying said wafer to a third treatment unit in a vacuum environment; and
    carrying out a removal of the resist of a mask pattern and a predetermined plasma treatment in said third treatment unit.

2. The continuous etching method according to claim 1, wherein the membrane to be etched consists of a plurality of layers, and when respective layers cannot be etched but in gases of fluorineous or chlorineous, each etching is done in individual treatment unit.

3. The continuous etching method according to claim 1, wherein a heating treatment is done simultaneous with a resist removal in the third treatment unit and then a plasma treatment is done so as to form a protective cover.

4. The conitnuous etching method according to claim 3, wherein the reaction gas for generating the protective cover is of hydrocarbon.

5. A continuous etching apapratus comprising:
    a vacuum chamber in which semiconductor wafers are conveyed in a vacuum environment;
    a load unit air-tightly installed to said vacuum chamber through a gate valve;
    an unload unit installed air-tightly to said vacuum chamber through a gate valve;
    a first etching unit air-tightly installed to said vacuum chamber through a gate valve;
    a second ethcing unit air-tightly installed to said vacuum chamber through a gate valve;
    an after-treatment unit air-tightly installed to said vacuum chamber through a gate valve;
    a first wafer waiting unit between the first etching unit and the second etching unit for holding the wafer for the second etching unit;
    a second wafer waiting unit between the second etching unit and the after-treatment unit for holding the wafer for the after-treatment unit; and
    means installed in said vacuum chamber for conveying the wafers between respective units or between a unit and an adjacent wafer waiting unit through said vacuum chamber.

6. The continuous etching apparatus set forth in claim 5, wherein said first etching unit and said second etching unit, respectively have cooling means, and said after-treatment unit has a heating means.

7. The continuous etching apapratus claimed in claim 6, wherein the cooling means has liquified nitrogen and a heating heater.

8. The continuous etching apparatus set forth in claim 6, wherein the cooling means has a refrigerator and a heating heater.

9. A continuous etching apparatus for etching semiconductor wafers comprising:
    a vacuum chamber in which the wafers are conveyed in a vacuum environment;
    a plurality of etching units installed on the vaccum chamber for etching the wafers;
    at least one wafer waiting unit to hold the wafers between etchings;
    means for conveying the wafers from an etching unit to a wafer waiting unit, wherein said means for conveying is located in the vacuum chamber; and
    a means for loading and unloading the wafers into and out of the vacuum chamber.

10. The continuous etching apparatus set forth in claim 9, wherein the means for loading and unloading is comprised of a loading unit and an unloading unit.

* * * * *